(12) United States Patent
Tang et al.

(10) Patent No.: US 11,769,833 B2
(45) Date of Patent: *Sep. 26, 2023

(54) METHOD FOR FABRICATING SEMICONDUCTOR DEVICE

(71) Applicant: UNITED MICROELECTRONICS CORP., Hsin-Chu (TW)

(72) Inventors: Chi-Hsuan Tang, Kaohsiung (TW); Chung-Ting Huang, Kaohsiung (TW); Bo-Shiun Chen, Taichung (TW); Chun-Jen Chen, Tainan (TW); Yu-Shu Lin, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/956,840

(22) Filed: Sep. 30, 2022

(65) Prior Publication Data
US 2023/0033820 A1    Feb. 2, 2023

Related U.S. Application Data

(63) Continuation of application No. 17/147,468, filed on Jan. 13, 2021, now Pat. No. 11,495,686.

(30) Foreign Application Priority Data

Dec. 15, 2020    (CN) .......................... 202011478662.1

(51) Int. Cl.
*H01L 29/78* (2006.01)
*H01L 29/66* (2006.01)
*H01L 21/02* (2006.01)
*H01L 29/06* (2006.01)

(52) U.S. Cl.
CPC ...... *H01L 29/7848* (2013.01); *H01L 21/0245* (2013.01); *H01L 29/0657* (2013.01); *H01L 29/6656* (2013.01); *H01L 29/66553* (2013.01)

(58) Field of Classification Search
CPC .......... H01L 21/0245; H01L 21/28141; H01L 21/823418; H01L 21/823814; H01L 29/0653; H01L 29/0657; H01L 29/41783; H01L 29/6653; H01L 29/66553; H01L 29/6656; H01L 29/66636; H01L 29/7848; H01L 29/78618
See application file for complete search history.

(56) References Cited

U.S. PATENT DOCUMENTS

| | | | |
|---|---|---|---|
| 6,319,782 B1 | 11/2001 | Nakabayashi | |
| 8,598,661 B2 | 12/2013 | Wang | |
| 11,495,686 B2 * | 11/2022 | Tang | .................. H01L 29/4966 |
| 2013/0001555 A1 * | 1/2013 | Yin | ................... H01L 21/28525 257/E21.409 |
| 2013/0240990 A1 | 9/2013 | Yin | |
| 2014/0001561 A1 * | 1/2014 | Cheng | ............. H01L 21/823814 257/369 |

(Continued)

*Primary Examiner* — David C Spalla
(74) *Attorney, Agent, or Firm* — Winston Hsu

(57) ABSTRACT

A method for fabricating a semiconductor device includes the steps of forming a gate structure on a substrate, forming an epitaxial layer adjacent to the gate structure, and then forming a first cap layer on the epitaxial layer. Preferably, a top surface of the first cap layer includes a curve concave upward and a bottom surface of the first cap layer includes a planar surface higher than a top surface of the substrate.

9 Claims, 4 Drawing Sheets

(56) References Cited

U.S. PATENT DOCUMENTS

| | | |
|---|---|---|
| 2016/0190250 A1 | 6/2016 | Kwok |
| 2016/0358916 A1 | 12/2016 | Adusumilli |
| 2016/0359012 A1* | 12/2016 | Yu ................... H01L 21/823431 |
| 2017/0040451 A1 | 2/2017 | Huang |
| 2021/0226057 A1* | 7/2021 | Chu ................ H01L 21/823475 |
| 2022/0052044 A1* | 2/2022 | More ................. H01L 27/0924 |
| 2022/0115519 A1* | 4/2022 | Lian ................... H01L 29/7851 |

* cited by examiner

METHOD FOR FABRICATING SEMICONDUCTOR DEVICE

CROSS REFERENCE TO RELATED APPLICATIONS

This application is a continuation application of U.S. application Ser. No. 17/147,468, filed on Jan. 13, 2021. The content of the application is incorporated herein by reference.

BACKGROUND OF THE INVENTION

1. Field of the Invention

The invention relates to a method for fabricating semiconductor device, and more particularly to a method of forming a cap layer with V-shape.

2. Description of the Prior Art

In order to increase the carrier mobility of semiconductor structure, it has been widely used to apply tensile stress or compressive stress to a gate channel. For instance, if a compressive stress were to be applied, it has been common in the conventional art to use selective epitaxial growth (SEG) technique to form epitaxial structure such as silicon germanium (SiGe) epitaxial layer in a silicon substrate. As the lattice constant of the SiGe epitaxial layer is greater than the lattice constant of the silicon substrate thereby producing stress to the channel region of PMOS transistor, the carrier mobility is increased in the channel region and speed of MOS transistor is improved accordingly. Conversely, silicon carbide (SiC) epitaxial layer could be formed in silicon substrate to produce tensile stress for gate channel of NMOS transistor.

However, epitaxial layers serving as primary stress-inducing structure in non-planar metal-oxide semiconductor (MOS) transistors, such as fin field effect transistors (FinFET) today are difficult to obtain an even surface through the fabrication process, thereby affecting the performance of the device. Hence, how to improve the current fabrication to resolve this issue has become an important task in this field.

SUMMARY OF THE INVENTION

According to an embodiment of the present invention, a method for fabricating a semiconductor device includes the steps of forming a gate structure on a substrate, forming an epitaxial layer adjacent to the gate structure, and then forming a first cap layer on the epitaxial layer. Preferably, a top surface of the first cap layer includes a curve concave upward and a bottom surface of the first cap layer includes a planar surface higher than a top surface of the substrate.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
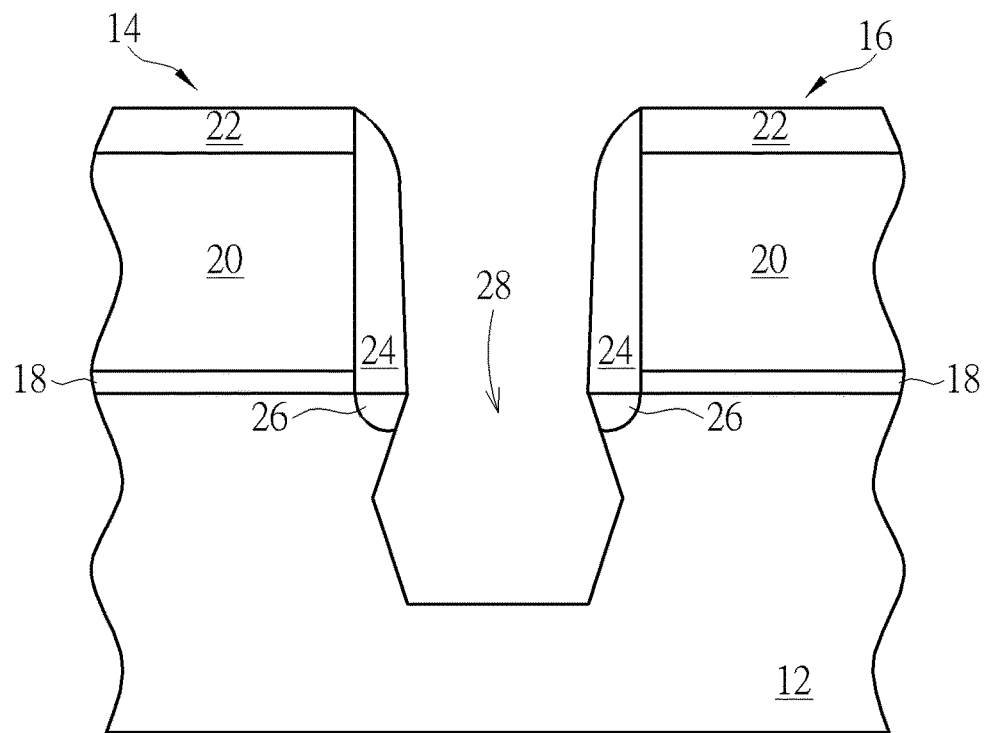
FIGS. 1-5 illustrate a method for fabricating semiconductor device according to an embodiment of the present invention.

Referring to FIGS. 1-5, FIGS. 1-5 illustrate a method for fabricating semiconductor device according to an embodiment of the present invention. As shown in FIG. 1, a substrate 12 is provided and gate structures 14, 16 are formed on the substrate 12. In this embodiment, the formation of the gate structures 14, 16 could be accomplished by sequentially forming a gate dielectric layer, a gate material layer, and a hard mask on the substrate 12, conducting a pattern transfer process by using a patterned resist (not shown) as mask to remove part of the hard mask, part of the gate material layer, and part of the gate dielectric layer through single or multiple etching processes, and then stripping the patterned resist. This forms gate structures 14 and 16 each composed of a patterned gate dielectric layer 18, a patterned gate material layer 20, and a patterned hard mask 22.

It should be noted that even though two gate structures 14, 16 are disclosed in this embodiment, the quantity or number of the gate structures 14, 16 is not limited to two, but could all be adjusted according to the demand of the product. Moreover, only part of the gate structures 14, 16, such as the right portion of the gate structure 14 and left portion of the gate structure 16 are shown in FIG. 1 to emphasize the formation of buffer layer and epitaxial layer between gate structures 14, 16 in later process.

In this embodiment, the substrate 12 could be a semiconductor substrate such as a silicon substrate, an epitaxial substrate, a SiC substrate, or a silicon-on-insulator (SOI) substrate, but not limited thereto. The gate dielectric layer 18 could include $SiO_2$, SiN, or high-k dielectric material; the gate material layer 20 could include metal, polysilicon, or silicide; and the material of hard mask 22 could be selected from the group consisting of $SiO_2$, SiN, SiC, and SiON.

According to an embodiment of the present invention, a plurality of doped wells or shallow trench isolations (STIs) could be selectively formed in the substrate 12. Despite the present invention pertains to a planar MOS transistor, it would also be desirable to apply the process of the present invention to non-planar transistors such as FinFET devices, and in such instance, the substrate 12 shown in FIG. 1 would become a fin-shaped structure formed atop a substrate 12.

Next, at least one spacer 24 is formed on the sidewalls of the gate structures 14 and 16. Optionally, after a lightly doped ion implantation processes is conducted, a rapid thermal annealing processes is performed at about 930° C. to active the dopants implanted in the substrate 12 for forming lightly doped drains 26 in the substrate 12 adjacent to two sides of the spacer 24. In this embodiment, the spacer 24 could be a single or composite spacer, in which the spacer 24 could further include an offset spacer (not shown) and a main spacer (not shown). The offset spacer and the main spacer are preferably made of different material while the offset spacer and main spacer could all be selected from the group consisting of $SiO_2$, SiN, SiON, and SiCN, but not limited thereto.

Next, a dry etching and/or wet etching process is conducted by using the gate structures 14, 16 and spacers 24 as mask to remove part of the substrate 12 through single or multiple etching processes for forming recesses 28 in the substrate 12 adjacent to two sides of the gate structures 14, 16. Preferably, the etching process could be accomplished by first conducting a dry etching process to form initial recesses (not shown) in the substrate 12 adjacent to two sides of the gate structure 16, and then conducting a wet etching process to expand the recesses isotropically for forming recess 28. According to an embodiment of the present invention, the wet etching process could be accomplished by using etchant including but not limited to for example ammonium hydroxide ($NH_4OH$) or tetramethylammonium hydroxide (TMAH). It should be noted that the formation of the recesses 28 is not limited to the combination of dry etching process and wet etching process addressed previously. Instead, the recesses 28 could also be formed by single or multiple dry etching and/or wet etching processes, which are all within the scope of the present invention. According to an embodiment of the present invention, each of the recesses 28 could have various cross-section shapes, including but not limited to for example a circle, a hexagon, or an octagon. Despite the cross-section of the recess 28 in this embodiment pertains to be a hexagon, it would also be desirable to form the recess 28 with aforementioned shapes, which are all within the scope of the present invention.

Figure 2:
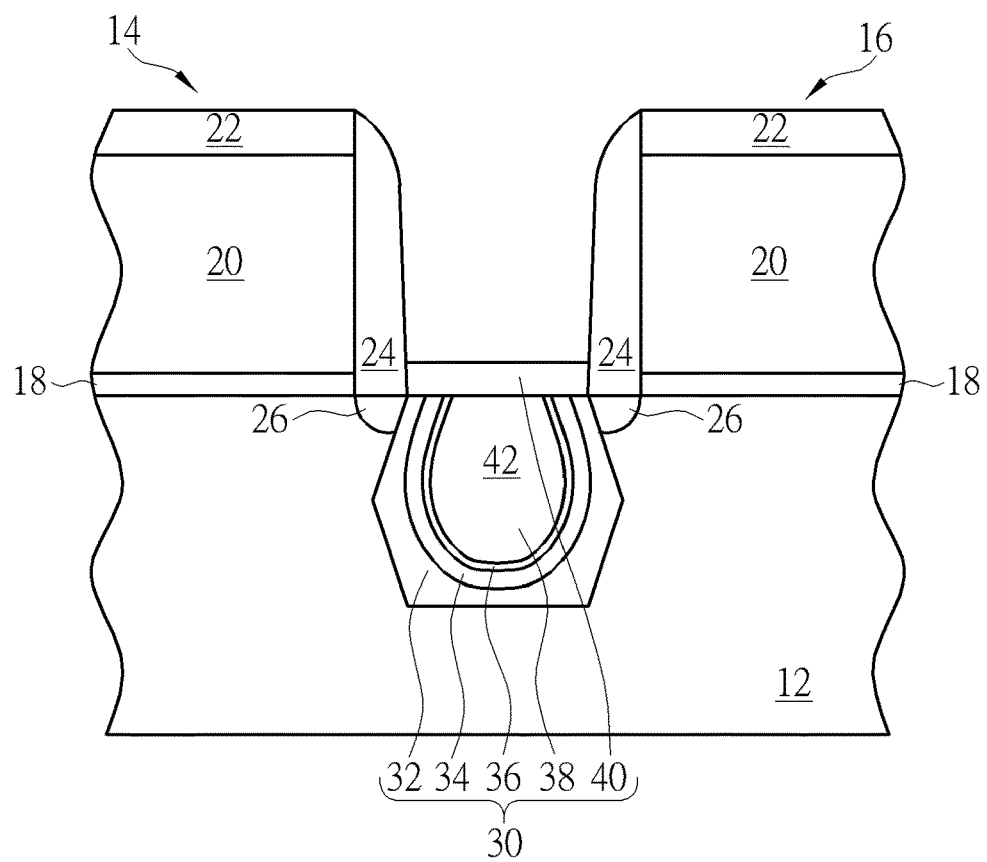

Next, as shown in FIG. 2, a selective epitaxial growth (SEG) is conducted by using gas such as dichlorosilane (DCS) to form an epitaxial layer 30 in each of the recesses 28, in which the epitaxial layer 30 includes a buffer layer 32 disposed on a surface of the recess 28, a first linear bulk layer 34 disposed on the buffer layer 32, a second linear bulk layer 36 disposed on the first linear bulk layer 34, a bulk layer 38 disposed on the second linear bulk layer 36, and a cap layer 40 disposed on the bulk layer 38.

In this embodiment, a top surface of the epitaxial layer 30 such as the top surface of the buffer layer 32, the top surface of the first linear bulk layer 34, the top surface of the second linear bulk layer 36, and the top surface of the bulk layer 38 are preferably even with a top surface of the substrate 12, in which the epitaxial layer 30 also shares substantially same cross-section shape with the recess 28. For instance, the cross-section of the epitaxial layer 30 could also include a circle, a hexagon, or an octagon depending on the demand of the product. In this embodiment, the epitaxial layer 30 could also be formed to include different material depending on the type of transistor being fabricated. For instance, if the MOS transistor being fabricated were to be a PMOS transistor, the epitaxial layer 30 could be made of material including but not limited to for example SiGe, SiGeB, or SiGeSn. If the MOS transistor being fabricated were to be a NMOS transistor, the epitaxial layer 30 could be made of material including but not limited to for example SiC, SiCP, or SiP. Moreover, the SEG process could also be adjusted to form a single-layered epitaxial structure or multi-layered epitaxial structure, in which heteroatom such as germanium atom or carbon atom of the structure could be formed to have gradient while the surface of the epitaxial layer 30 is preferred to have less or no germanium atom at all to facilitate the formation of silicide afterwards. It should be noted that even though the top surfaces of the substrate 12 and buffer layer 32, first linear bulk layer 34, second linear bulk layer 36, and bulk layer 38 of the epitaxial layer 30 are coplanar in this embodiment, it would also be desirable extend the epitaxial layer 30 upward so that the top surfaces of the buffer layer 32, first linear bulk layer 34, second linear bulk layer 36, and bulk layer 38 are higher than the top surface of the substrate 12 according to another embodiment of the present invention.

Next, an ion implantation process is conducted to form a source/drain region 42 in part or all of the epitaxial layer 30.

According to another embodiment of the present invention, the source/drain region 42 could also be formed insituly during the SEG process. For instance, the source/drain region 42 could be formed by implanting p-type dopants during formation of a SiGe epitaxial layer, a SiGeB epitaxial layer, or a SiGeSn epitaxial layer for PMOS transistor, or could be formed by implanting n-type dopants during formation of a SiC epitaxial layer, SiCP epitaxial layer, or SiP epitaxial layer for NMOS transistor. By doing so, it would be desirable to eliminate the need for conducting an extra ion implantation process for forming the source/drain region. Moreover, the dopants within the source/drain region 42 could also be formed with a gradient, which is also within the scope of the present invention.

It should be noted the epitaxial layer 30 in this embodiment preferably includes SiGe and the buffer layer 32, the first linear bulk layer 34, the second linear bulk layer 36, the bulk layer 38, and the cap layer 40 preferably include different concentration distributions and distribution curves. For instance, the germanium (Ge) concentration of the buffer layer 32 is preferably less than the germanium concentration of the first linear bulk layer 34, the germanium concentration of the first linear bulk layer 34 is less than the germanium concentration of the second linear bulk layer 36, the germanium concentration of the second linear bulk layer 36 is less than the germanium concentration of the bulk layer 38, and the germanium concentration of the cap layer 40 is less than the germanium concentration of the bulk layer 38, in which the slope of the germanium concentration of the first linear bulk layer 34 is preferably less than the slope of the germanium concentration of the second linear bulk layer 36, and the thickness of the second linear bulk layer 36 is less than the thickness of the first linear bulk layer 34.

Preferably, the Ge concentration of the buffer layer 32 is between 30% to 33%, the Ge concentration of the first linear bulk layer 34 is less than 39%, the Ge concentration of the second linear bulk layer 36 is between 39% to 47%, the Ge concentration of the bulk layer 38 is between 47% to 60%, and the Ge concentration of the cap layer 40 is between 28% to 30%. Moreover, the thickness of the buffer layer 32 is preferably about 100 Angstroms, the thickness of the first linear bulk layer 34 is about 100 Angstroms, the thickness of the second linear bulk layer 36 is between 30-50 Angstroms, and the thickness of the bulk layer 38 is between 200-300 Angstroms.

Figure 3:
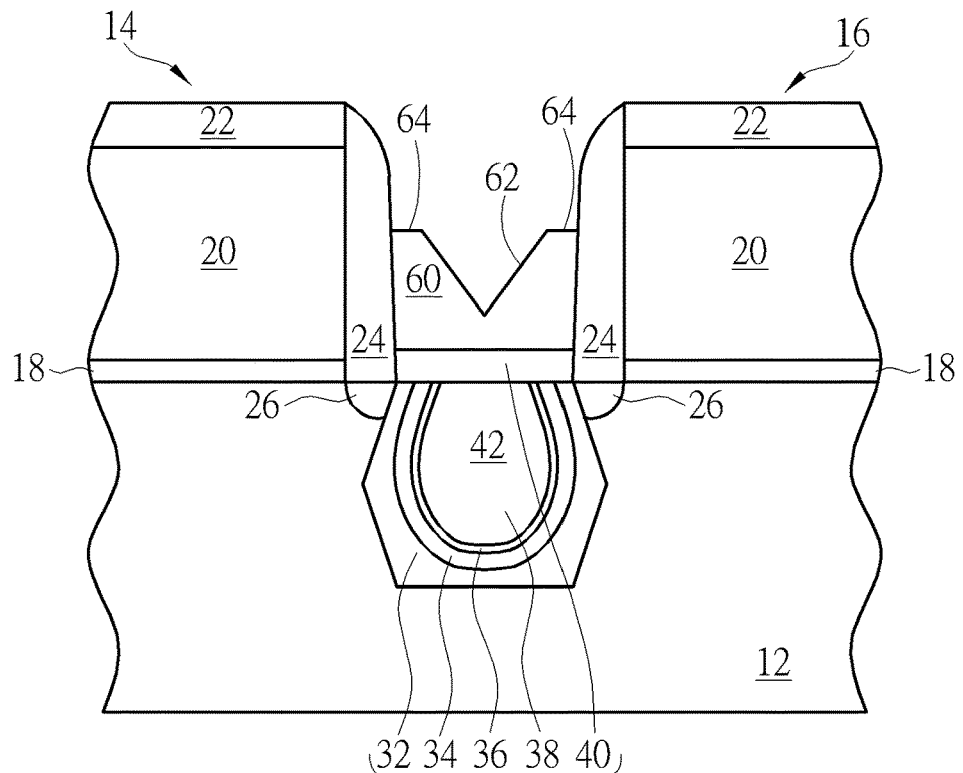

Next, as shown in FIG. 3, precursors such as silane ($SiH_4$) and dichlorosilane (DCS) are employed with other reacting gases to form a cap layer 60 made of silicon on the surface of the cap layer 40. It should be noted that the formation of the cap layer 60 is accomplished by injecting the aforementioned precursors and other reacting gases such as hydrogen chloride (HCl) and/or diborane ($B_2H_2$) without injecting any germanium-containing gas such as germane ($GeH_4$). Preferably, the flow of germane for forming the epitaxial layer 30 is between 180-300 sccm, the flow of DCS is between 60-100 sccm, the flow of HCl is between 40-100 sccm, and the flow of diborane is between 200-300 sccm. Moreover, the deposition time of the cap layer 60 is between 120-170 seconds, the fabrication temperature is between 740-770° C., and the pressure is between 5-20 Torr.

By using the above recipe and parameters, it would be desirable to form a bowl-shape cap layer 60 on the surface of the cap layer 40, in which the top surface of the cap layer 60 preferably includes a V-shape 62 profile and two planar surfaces 64 connecting and extending at two sides of the V-shape 62. Preferably, this particular profile of the cap layer 60 could be used to protect the spacers in particular the offset spacers from forming voids as a result of damages caused by series of etching processes conducted in the later process and defect of the semiconductor device could also be reduced substantially.

Figure 4:
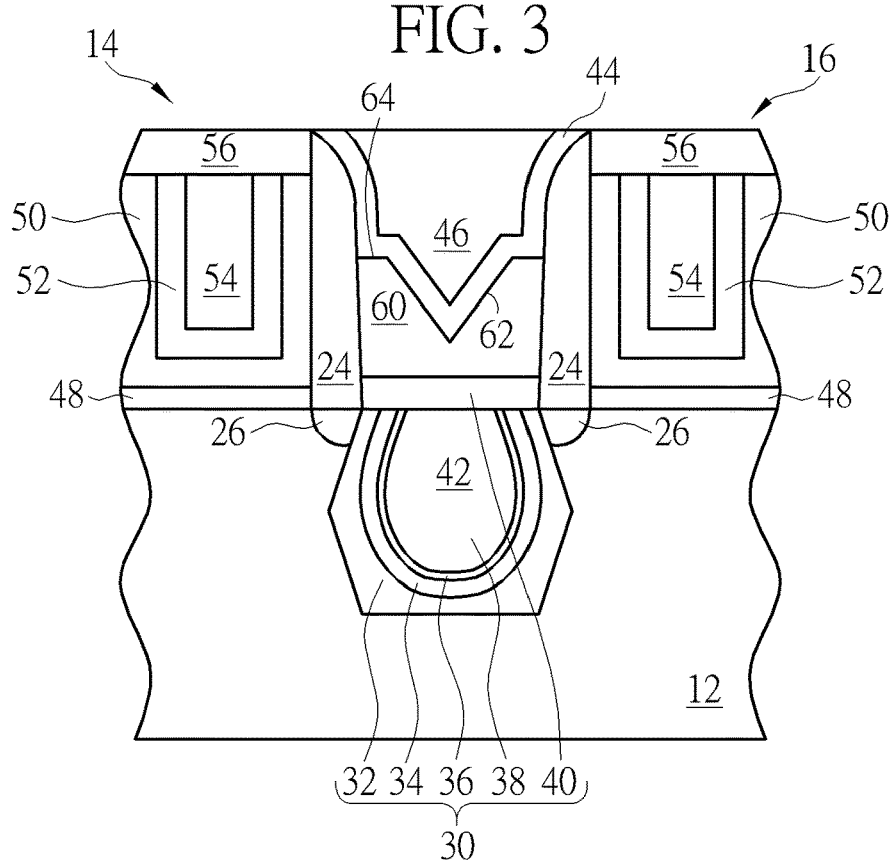

Next, as shown in FIG. 4, a contact etch stop layer (CESL) 44 could be formed on the substrate 12 surface to cover the gate structures 14, 16 and the cap layer 60, and an interlayer dielectric (ILD) layer 46 is formed on the CESL 44 afterwards. Next, a planarizing process such as a chemical mechanical polishing (CMP) process is conducted to remove part of the ILD layer 46 and part of the CESL 44 so that the top surfaces of the hard mask 22 and ILD layer 46 are coplanar.

Next, a replacement metal gate (RMG) process is conducted to transform the gate structures 14, 16 into metal gates. For instance, the RMG process could be accomplished by first performing a selective dry etching or wet etching process using etchants including but not limited to for example ammonium hydroxide ($NH_4OH$) or tetramethylammonium hydroxide (TMAH) to remove the hard masks 22, the gate material layer 20, and even the gate dielectric layer 18 from gate structures 14, 16 for forming recesses (not shown) in the ILD layer 46. Next, a selective interfacial layer 48 or gate dielectric layer (not shown), a high-k dielectric layer 50, a work function metal layer 52, and a low resistance metal layer 54 are formed in the recesses, and a planarizing process such as CMP is conducted to remove part of low resistance metal layer 54, part of work function metal layer 52, and part of high-k dielectric layer 50 to form metal gates. In this embodiment, each of the gate structures or metal gates fabricated through high-k last process of a gate last process preferably includes an interfacial layer 48 or gate dielectric layer (not shown), a U-shaped high-k dielectric layer 50, a U-shaped work function metal layer 52, and a low resistance metal layer 54.

In this embodiment, the high-k dielectric layer 50 is preferably selected from dielectric materials having dielectric constant (k value) larger than 4. For instance, the high-k dielectric layer 50 may be selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT), barium strontium titanate ($Ba_xSr_{1-x}TiO_3$, BST) or a combination thereof.

In this embodiment, the work function metal layer 52 is formed for tuning the work function of the metal gate in accordance with the conductivity of the device. For an NMOS transistor, the work function metal layer 52 having a work function ranging between 3.9 eV and 4.3 eV may include titanium aluminide (TiAl), zirconium aluminide (ZrAl), tungsten aluminide (WAl), tantalum aluminide (TaAl), hafnium aluminide (HfAl), or titanium aluminum carbide (TiAlC), but it is not limited thereto. For a PMOS transistor, the work function metal layer 52 having a work function ranging between 4.8 eV and 5.2 eV may include titanium nitride (TiN), tantalum nitride (TaN), tantalum carbide (TaC), but it is not limited thereto. An optional barrier layer (not shown) could be formed between the work function metal layer 52 and the low resistance metal layer 54, in which the material of the barrier layer may include titanium (Ti), titanium nitride (TiN), tantalum (Ta) or tantalum nitride (TaN). Furthermore, the material of the low-resistance metal layer 54 may include copper (Cu), aluminum (Al), titanium aluminum (TiAl), cobalt tungsten phosphide (CoWP) or any combination thereof.

Next, part of the high-k dielectric layer 50, part of the work function metal layer 52, and part of the low resistance metal layer 54 are removed to form recesses (not shown), and hard masks 56 are then formed into the recesses so that the top surfaces of the hard masks 56 and ILD layer 46 are coplanar. The hard masks 56 could be made of material including but not limited to for example $SiO_2$, SiN, SiON, SiCN, or combination thereof.

Figure 5:
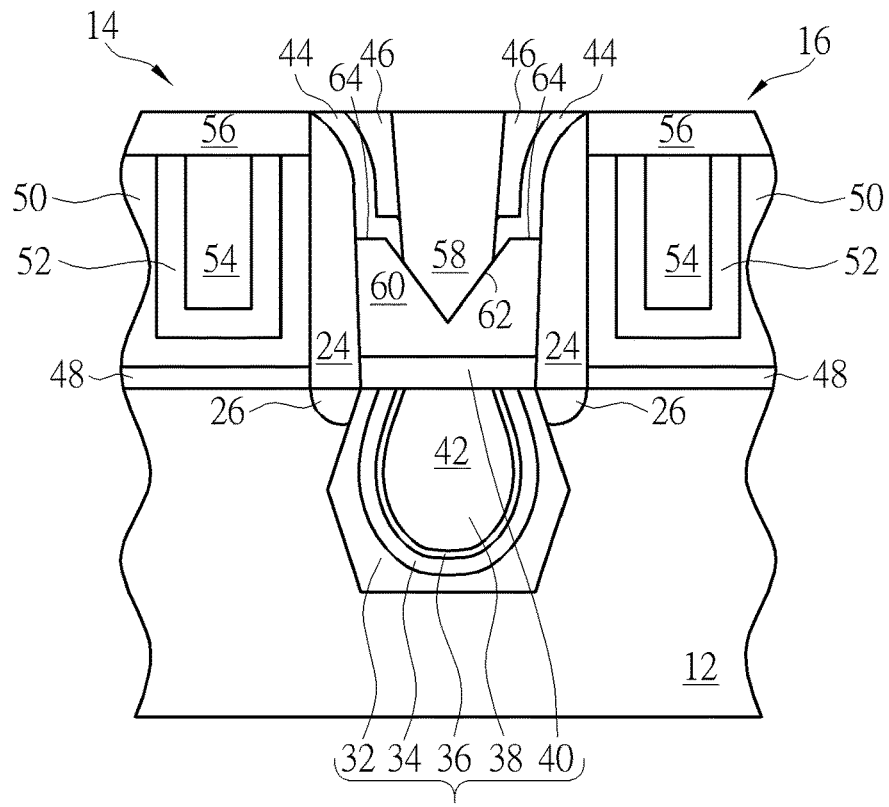

Next, as shown in FIG. 5, a photo-etching process is conducted by using a patterned mask (not shown) as mask to remove part of the ILD layer 46 and part of the CESL 44 adjacent to the gate structures 14, 16 for forming contact holes (not shown) exposing the cap layer 40 underneath. Next, conductive materials including a barrier layer selected from the group consisting of titanium (Ti), titanium nitride (TiN), tantalum (Ta), and tantalum nitride (TaN) and a metal layer selected from the group consisting of tungsten (W), copper (Cu), aluminum (Al), titanium aluminide (TiAl), and cobalt tungsten phosphide (CoWP) are deposited into the contact holes, and a planarizing process such as CHIP is conducted to remove part of aforementioned barrier layer and low resistance metal layer for forming contact plugs 58 electrically connecting the source/drain regions 42. This completes the fabrication of a semiconductor device according to an embodiment of the present invention.

Referring again to FIG. 5, FIG. 5 further illustrates a structural view of a semiconductor device according to an embodiment of the present invention. As shown in FIG. 5, the semiconductor device includes at least a gate structure 14 disposed on the substrate 12, a spacer 24 disposed on sidewalls of the gate structure 14, epitaxial layers 30 disposed in the substrate 12 adjacent to two sides of the spacer 24, and cap layers 60 disposed on the epitaxial layers 30, in which each of the epitaxial layers 30 include a buffer layer 32, a first linear bulk layer 34, a second linear bulk layer 36, a bulk layer 38, and a cap layer 40.

In this embodiment, the top surface of the cap layer 40 is higher than the top surface of the substrate 12, the bottom surface of the cap layer 40 is even with the top surface of the substrate 12, the buffer layer 32, first linear bulk layer 34, second linear bulk layer 36, bulk layer 38, and cap layer 40 of the epitaxial layer 30 are preferably made of same material such as SiGe while having germanium concentration curves as disclosed previously, the cap layer 40 and cap layer 60 are made of different materials as the cap layer 60 is preferably made of silicon, the bottom surface of the cap layer 60 is higher than the top surface of the substrate 12, and the top surface of the cap layer 60 could be lower than or higher than half the height of the gate structure 14.

Figure 6:
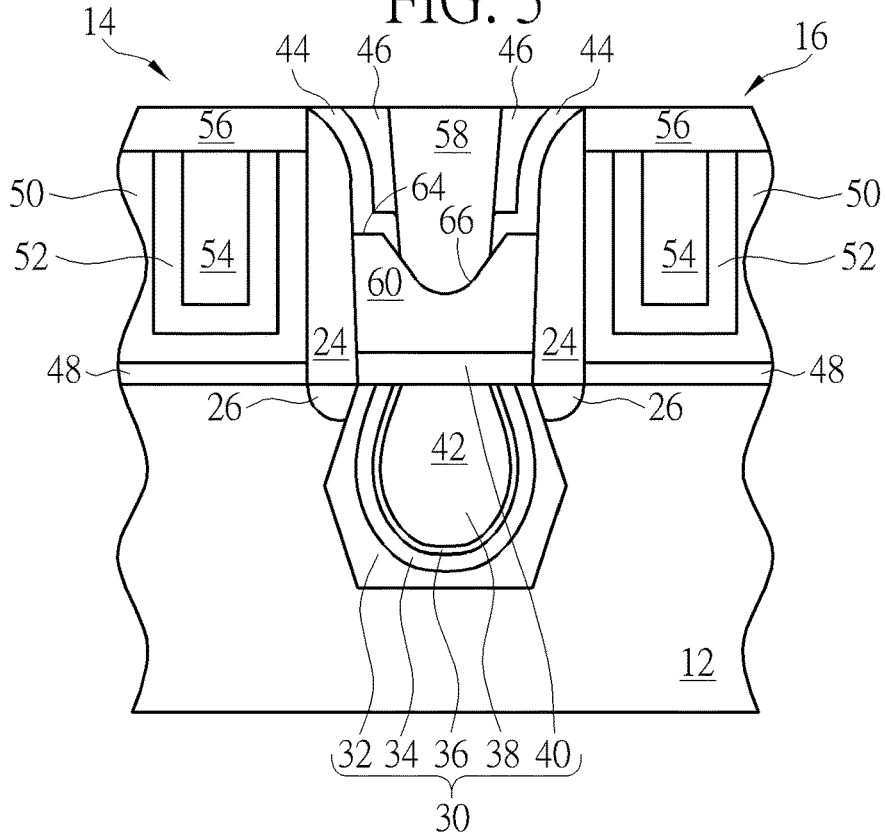
FIG. 6 illustrates a structural view of a semiconductor device according to an embodiment of the present invention.

Structurally the cap layer 60 includes a bowl-like shape overall, in which the top surface of the cap layer 60 includes a V-shape 62 and two planar surfaces 64 parallel to the top surface of the substrate 12 and connecting to two sides of the V-shape 62 respectively. Nevertheless, according to an embodiment of the present invention as shown in FIG. 6, the bottom portion of the V-shape 62 shown in FIG. 5 could also be replaced by a curve 66 concave upward as the curve 66 is also connected to planar surfaces 62 adjacent to two sides of the curve 66, which is also within the scope of the present invention.

Figure 7:
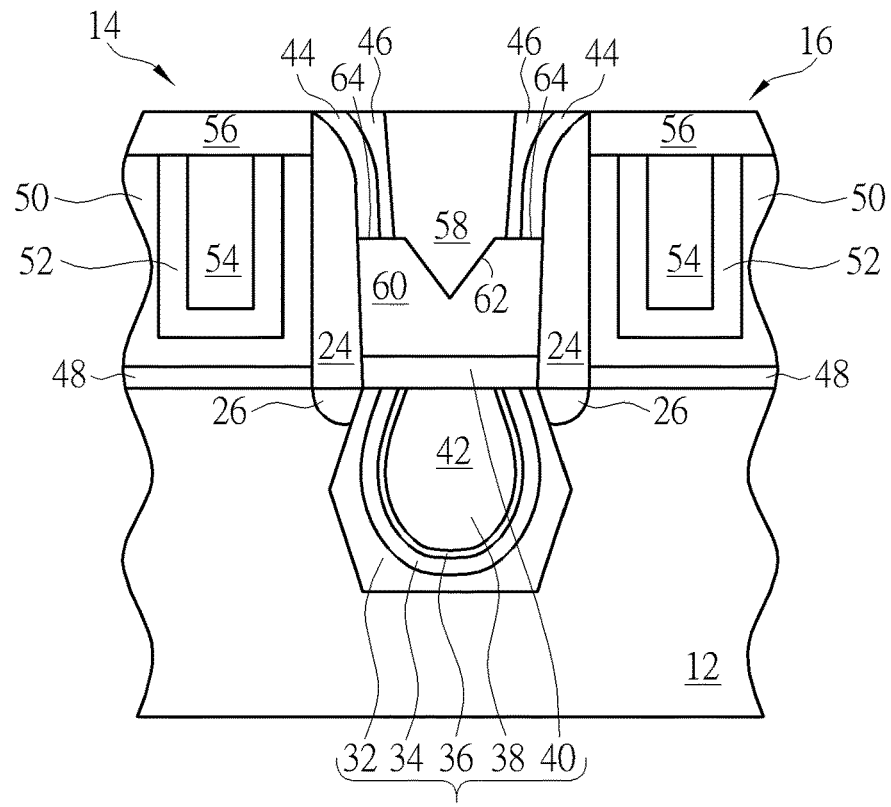
FIG. 7 illustrates a structural view of a semiconductor device according to an embodiment of the present invention.
Figure 8:
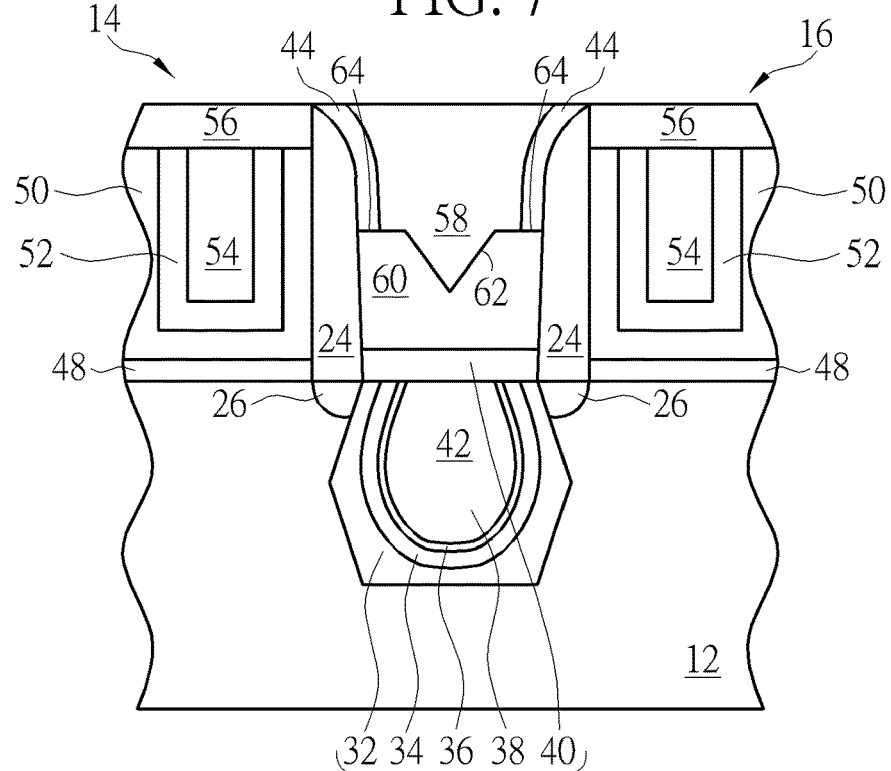
FIG. 8 illustrates a structural view of a semiconductor device according to an embodiment of the present invention.

As shown in FIGS. 7-8, FIGS. 7-8 illustrate structural views of a semiconductor device according to different embodiments of the present invention. As shown in FIG. 7, in contrast to the bottom surface of the contact plug 58 only includes a V-shape profile or the bottom surface of the contact plug 58 only contacts the V-shape profile of the cap layer 60 as shown in FIG. 5, it would also be desirable to extend the width of the contact plug 58 so that the bottom surface of the contact plug 58 is standing on both the V-shape 62 profile and two adjacent planar surfaces 64 of the cap layer 60 or if viewed from another perspective the bottom surface of the contact plug 58 itself includes a V-shape 62 profile and two planar surfaces 64 adjacent to two sides of the V-shape 62 profile, which is also within the scope of the present invention.

Alternatively, as shown in FIG. 8, it would also be desirable to further extend the width of the contact plug 58 as shown in FIG. 7 by eliminating the ILD layer 46 so that not only the bottom surface of the contact plug 58 includes a V-shape 62 profile and two planar surfaces 64 adjacent to two sides of the V-shape 62 profile but also the left and right sidewalls of the contact plug 58 contact the CESL 44 instead of the ILD layer 46 directly, which is also within the scope of the present invention.

Overall, the present invention first forms an epitaxial layer having a buffer layer, a bulk layer, and a cap layer all made of SiGe and then forms a cap layer 60 made of silicon having a V-shape profile and two planar surfaces connecting and adjacent to two sides of the V-shape profile on the surface of the epitaxial layer. Preferably, the particular bowl-shape profile of the cap layer 60 could be used to protect the spacers from forming voids as a result of damages caused by series of etching processes conducted in the later process and defect of the semiconductor device could also be minimized substantially.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating a semiconductor device, comprising:
    forming a gate structure on a substrate;
    forming an epitaxial layer adjacent to the gate structure; and
    forming a first cap layer on the epitaxial layer, wherein the first cap layer is made of silicon, a top surface of the first cap layer comprises a curve concave upward, and a bottom surface of the first cap layer comprises a planar surface higher than a top surface of the substrate.

2. The method of claim 1, further comprising:
    forming a spacer adjacent to the gate structure; and
    forming the epitaxial layer adjacent to the spacer.

3. The method of claim 1, wherein the epitaxial layer comprises a second cap layer and the first cap layer is on the second cap layer.

4. The method of claim 3, wherein a top surface of the second cap layer is higher than a top surface of the substrate.

5. The method of claim 3, wherein a bottom surface of the second cap layer is even with a top surface of substrate.

6. The method of claim 3, wherein the first cap layer and the second cap layer comprise different materials.

7. The method of claim 3, wherein the epitaxial layer and the first cap layer comprise different materials.

8. The method of claim 1, wherein a bottom surface of the first cap layer is higher than a top surface of the substrate.

9. The method of claim 1, wherein a top surface of the first cap layer is higher than half the height of the gate structure.

* * * * *